United States Patent
Sugimoto et al.

(10) Patent No.: US 8,315,027 B2
(45) Date of Patent: Nov. 20, 2012

(54) SWITCH CIRCUIT HAVING OVERCURRENT DETECTION FUNCTION

(75) Inventors: Shigekazu Sugimoto, Takahama (JP); Kazunori Ozawa, Chiryu (JP); Koichi Watanabe, Tsushima (JP)

(73) Assignee: Anden Co., Ltd., Anjo (JP)

(*) Notice: Subject to any disclaimer, the term of this patent is extended or adjusted under 35 U.S.C. 154(b) by 178 days.

(21) Appl. No.: 12/911,096

(22) Filed: Oct. 25, 2010

(65) Prior Publication Data

US 2011/0110009 A1    May 12, 2011

(30) Foreign Application Priority Data

Nov. 12, 2009  (JP) .................................. 2009-258784

(51) Int. Cl.
*H02H 3/08* (2006.01)
*H02H 9/02* (2006.01)
(52) U.S. Cl. ..................... 361/93.1; 361/93.2; 361/93.7; 361/100; 361/101
(58) Field of Classification Search ......................... None
See application file for complete search history.

(56) References Cited

U.S. PATENT DOCUMENTS

| | | | | |
|---|---|---|---|---|
| 3,970,901 A | * | 7/1976 | Rohr | 361/87 |
| 4,771,357 A | * | 9/1988 | Lorincz et al. | 361/87 |
| 5,375,029 A | * | 12/1994 | Fukunaga et al. | 361/101 |
| 6,320,275 B1 | | 11/2001 | Okamoto et al. | |
| 2006/0221528 A1 | * | 10/2006 | Li et al. | 361/100 |
| 2008/0212246 A1 | * | 9/2008 | Tanaka et al. | 361/86 |
| 2009/0219654 A1 | * | 9/2009 | Fitzpatrick | 361/18 |

FOREIGN PATENT DOCUMENTS

| | | |
|---|---|---|
| JP | A-2001-160747 | 6/2001 |
| JP | A-2009-261088 | 11/2009 |
| JP | A-2009-303394 | 12/2009 |

* cited by examiner

*Primary Examiner* — Jared Fureman
*Assistant Examiner* — Terrence Willoughby
(74) *Attorney, Agent, or Firm* — Posz Law Group, PLC

(57) ABSTRACT

A first overcurrent detecting circuit outputs a first time-up signal when a time period, in which an electric current flowing into the wire harness is greater than the first threshold, reaches a first duration time, which corresponds to a first threshold. A second overcurrent detecting circuit outputs a second time-up signal when a time period, in which an electric current flowing into the wire harness is greater than the second threshold, reaches a second duration time, which corresponds to a second threshold. The second threshold is less than the first threshold. The second duration time is longer than the first duration time. A determination circuit determines that an overcurrent flows into the wire harness and cause a control circuit to deactivate the switching element when inputting at least one of the first and second time-up signals.

4 Claims, 7 Drawing Sheets

SWITCH CIRCUIT HAVING OVERCURRENT
DETECTION FUNCTION

CROSS REFERENCE TO RELATED
APPLICATIONS

This application is based on and incorporates herein by reference Japanese Patent Application No. 2009-258784 filed on Nov. 12, 2009.

FIELD OF THE INVENTION

The present invention relates to a switch circuit having an overcurrent detection function.

BACKGROUND OF THE INVENTION

For example, Japanese patent publications 3625165, 3656412 propose conventional devices each provided with an overcurrent detection function. For example, in Japanese patent publications 3625165 and 3656412, when a rush current occurs on activation (ON) of a load element, an overcurrent detection threshold is switched to a value greater than the rush current in response to a driving signal (trigger) for activating the load element. In this way, a rush current caused on activation of a load element can be restricted from being detected as an overcurrent. Subsequent to the activation of the load element, the overcurrent detection threshold is decreased to be less than a rush current with time progress, thereby to enable overcurrent detection while the load element is in operation. For example, a switch circuit may include multiple load elements connected to a single wire and each supplied with an electric current. In this case, it is unknown when one and another of the load elements are activated. Specifically, the multiple load elements may be activated at arbitrary time points. Consequently, a rush current may be caused at each of the time points. When such a rush current becomes greater than an overcurrent threshold, the rush current may be detected as an over current.

SUMMARY OF THE INVENTION

In view of the foregoing and other problems, it is an object of the present invention to produce a switch circuit having an overcurrent detection function for multiple load elements connected to a single wire, the switch circuit being configured not to detect a rush current, which flows into the wire when the load elements are activated at arbitrary time points, as an overcurrent.

According to one aspect of the present invention, a switch circuit having an overcurrent detection function for detecting an overcurrent flowing into a single wire harness, which is connected with a plurality of load elements equipped to a vehicle, the switch circuit comprises a switching element connected to the wire harness. The switch circuit further comprises a control circuit configured to control activation and deactivation of the switching element. The switch circuit further comprises a threshold circuit assigned with a first overcurrent threshold and a second overcurrent threshold, the second overcurrent threshold being less than the first overcurrent threshold. The switch circuit further comprises a first overcurrent detecting circuit configured to: measure a time period, in which an electric current flowing into the wire harness is greater than the first overcurrent threshold, according to the electric current flowing into the wire harness and the first overcurrent threshold; and output the first time-up signal exhibiting an overcurrent when the measured time period reaches a first overcurrent duration time, which corresponds to the first overcurrent threshold. The switch circuit further comprises a second overcurrent detecting circuit configured to: measure a time period, in which an electric current flowing into the wire harness is greater than the second overcurrent threshold, according to the electric current flowing into the wire harness and the second overcurrent threshold; and output a second time-up signal exhibiting an overcurrent when the measured time period reaches a second overcurrent duration time, which corresponds to the second overcurrent threshold, the second overcurrent duration time being longer than the first overcurrent duration time. The switch circuit further comprises an overcurrent determination circuit configured to determine that an overcurrent flows into the wire harness and cause a control circuit to deactivate the switching element when inputting at least one of the first time-up signal and the second time-up signal.

According to another aspect of the present invention, a switch circuit having an overcurrent detection function for detecting an overcurrent flowing into a single wire harness, which is connected with a plurality of load elements equipped to a vehicle, the switch circuit comprises a switching element connected to the wire harness. The switch circuit further comprises a control circuit configured to control activation and deactivation of the switching element. The switch circuit further comprises a threshold circuit assigned with a first overcurrent threshold and a second overcurrent threshold, the second overcurrent threshold being less than the first overcurrent threshold. The switch circuit further comprises a first overcurrent detecting circuit configured to output a comparison result that an electric current flowing into the wire harness is greater than the first overcurrent threshold at a first cycle, which corresponds to the first overcurrent threshold, according to the electric current flowing into the wire harness and the first overcurrent threshold. The switch circuit further comprises a second overcurrent detecting circuit configured to output a comparison result that an electric current flowing into the wire harness is greater than the second overcurrent threshold at a second cycle, which corresponds to the second overcurrent threshold and is greater than the first cycle, according to the electric current flowing into the wire harness and the second overcurrent threshold. The switch circuit further comprises a counter configured to count output signals of each of the first overcurrent detecting circuit and the second overcurrent detecting circuit and determine that an overcurrent flows into the wire harness to cause the control circuit to deactivate the switching element when a total count value reaches a count-up value. The second overcurrent detecting circuit is configured not to output a comparison result that an electric current flowing into the wire harness is greater than the second overcurrent threshold when the first overcurrent detecting circuit outputs a comparison result that the electric current flowing into the wire harness is greater than the first overcurrent threshold.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENTS

Figure 1:
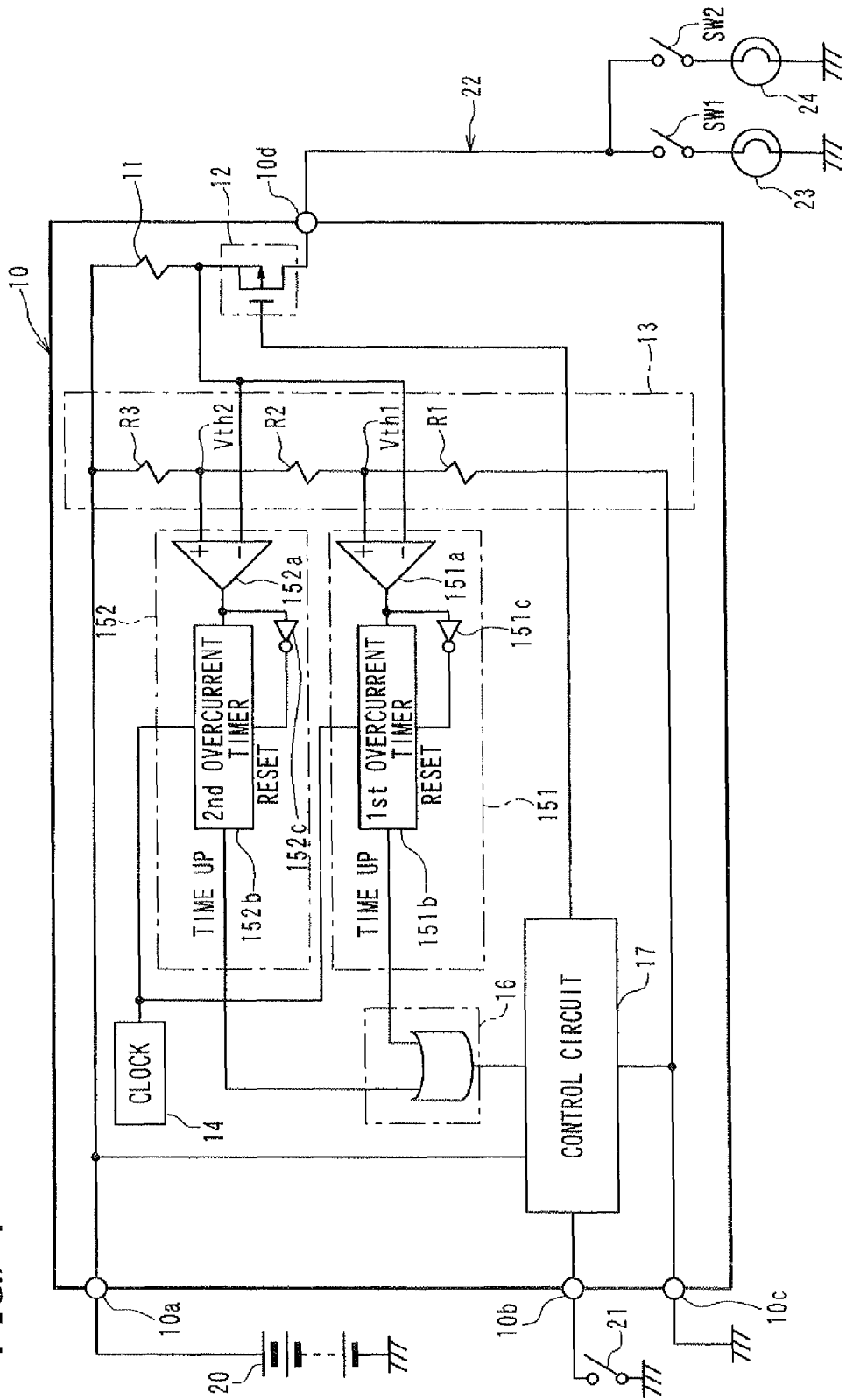
FIG. 1 is an overview showing a power supply system including a switch circuit according to a first embodiment of the present invention.

As follows, embodiments of the present invention will be described with reference to drawings. In each of the following embodiments, the same elements or equivalent elements are denoted by the same reference numeral in the drawings.

(First Embodiment)

As follows, the first embodiment will be described with reference to drawings. A switch device circuit according to the present embodiment having an overcurrent detection function is configured to be equipped to, for example, a vehicle. The switch device circuit is configured as a power supply unit to supply an electric power to multiple load elements connected to one wire harness. The switch device circuit is further configured to detect an overcurrent flowing through the wire harness.

FIG. 1 is an overview showing a power supply system including a switch circuit according to the present embodiment. As depicted, the switch circuit 10 includes a battery terminal 10a, an input terminal 10b, a ground terminal 10c, and a power supply terminal 10d.

The battery terminal 10a is connected to a battery 20. Electric power is supplied from the battery 20 to the switch circuit 10. The input terminal 10b is connected to an electric power switch 21, which is for activating the switch circuit 10. The ground terminal 10c is connected to a body of the vehicle and grounded. The power supply terminal 10d is connected to a single wire harness 22 equipped in the vehicle. A battery voltage applied to the battery terminal 10a is further applied to the wire harness 22 through the power supply terminal 10d.

The wire harness 22 is connected with multiple load elements 23, 24 through switch devices SW1, SW2. Specifically, the switch device SW1 is connected to the load element 23 in series, and the switch device SW1 is connected to the wire harness 22. Similarly, the switch device SW2 is connected to the load element 24 in series, and the switch device SW2 is connected to the wire harness 22. Thereby, the battery voltage is applied to each of the load elements 23, 24 on activation (turning ON) of each of the switch devices SW1, SW2. The load elements 23, 24 may be a light emitting diode (LED), a lamp, and/or the like equipped to the vehicle.

The switch circuit 10 includes a shunt resistor 11, a switching element 12, a threshold circuit 13, a clock 14, a first overcurrent detecting circuit 151, a second overcurrent detecting circuit 152, an overcurrent determination circuit 16, and a control circuit 17.

The shunt resistor 11 is connected to the battery terminal 10a for detecting an electric current.

The switching element 12 is a semiconductor device connected between the shunt resistor 11 and the power supply terminal 10d for functioning as a switch device. The switching element 12 may be a power MOSFET, an IGBT, or a bipolar transistor. The switching element 12 may be an electromagnetic relay device. In the present embodiment, a p-channel type MOSFET device is employed as the switching element 12. A source of the switching element 12 is connected to the shunt resistor 11, and a drain of the switching element 12 is connected to the power supply terminal 10d. A gate of the switching element 12 is connected to the control circuit 17.

The threshold circuit 13 is configured to divide the voltage of the battery terminal 10a to generate multiple overcurrent thresholds. The present "overcurrent threshold" is used for detecting an overcurrent, which flows through the wire harness 22 (i.e., shunt resistor 11). The threshold circuit 13 includes multiple resistor elements R1 to R3, which are connected in series.

Among the resistor elements R1 to R3, the resistor element R1 is connected to the ground terminal 10c, and the resistor element R3 is connected to the battery terminal 10a. In the present structure, the battery voltage applied to the battery terminal 10a is divided by the resistor elements R1 to R3 to generate divided voltages, and the divided voltages are outputted as overcurrent threshold voltages corresponding to overcurrent thresholds TH1, TH2. Specifically, the voltage Vth1 of a connecting point between the resistor element R1 and the resistor element R2 corresponds to the first overcurrent threshold TH1. The voltage Vth2 of a connecting point between the second resistor element R2 and the resistor element R3 corresponds to the second overcurrent threshold TH2. The second overcurrent threshold TH2 is less than the first overcurrent threshold TH1.

The clock 14 is a circuit device configured to generate a clock signal. The clock signal generated by the clock 14 is outputted to the first overcurrent detecting circuit 151 and the second overcurrent detecting circuit 152.

The first overcurrent detecting circuit 151 is configured to compare an electric current flowing into the wire harness 22 with the first overcurrent threshold TH1 to detect an overcurrent flowing into the wire harness 22. The first overcurrent detecting circuit 151 includes a first comparator 151a, a first overcurrent timer 151b, and a first reset circuit 151c.

The first comparator 151a compares an electric current flowing into the wire harness 22 with the first overcurrent threshold TH1. In reality, an electric current flowing into the wire harness 22 is converted into a voltage of a connecting point between the shunt resistor 11 and the switching element 12, and the converted voltage is compared with the first overcurrent threshold TH1.

The first comparator 151a has a noninverting input terminal to input the voltage of the connecting point between the shunt resistor 11 and the switching element 12. The first comparator 151a further has an inverting input terminal to input the first overcurrent threshold voltage Vth1 corresponding to the first overcurrent threshold TH1 from the threshold circuit 13. The first comparator 151a is further configured to compare the input voltage with the first overcurrent threshold voltage Vth1. The first comparator 151a compares the first overcurrent threshold TH1 with an electric current flowing into the wire harness 22.

As an electric current flowing into the wire harness 22 becomes large, the voltage of the connecting point between the shunt resistor 11 and the switching element 12 becomes small. In this way, the voltage of the connecting point becomes less than the first overcurrent threshold voltage Vth1. In this case, an electric current flowing into the wire harness 22 becomes greater than the first overcurrent threshold TH1. Thus, the first comparator 151a outputs a high-level signal.

The first overcurrent timer 151b measures a time period in which the electric current flowing into the wire harness 22 becomes greater than the first overcurrent threshold TH1. Specifically, the first overcurrent timer 151b measures the time period in which the first overcurrent timer 151b inputs the high-level signal from the first comparator 151a based on a clock signal outputted from the clock 14. The first overcurrent timer 151b outputs a first time-up signal when the measured time period reaches the first overcurrent duration time, which corresponds to the first overcurrent threshold TH1, to cause time out (time up). The first time-up signal is a high-level signal exhibiting that an overcurrent flows into the wire harness 22.

A first reset circuit 151c resets the measured time period of the first overcurrent timer 151b. The first reset circuit 151c is a NOT circuit configured to invert an output signal of the first comparator 151a and output the inverted signal to the first overcurrent timer 151b. In the present structure, when the voltage applied to the wire harness 22 becomes less than the first overcurrent threshold TH1, the first comparator 151a outputs a low-level signal. In response to the low-level signal, the first reset circuit 151c outputs a high-level signal to the first overcurrent timer 151b to reset the measured time period of the first overcurrent timer 151b. In this way, even when an electric current greater than the first overcurrent threshold TH1 flows into the wire harness 22, the measured time period of the first overcurrent timer 151b can be reset whenever the electric current completes flowing.

The second overcurrent detecting circuit 152 is configured to compare an electric current flowing into the wire harness 22 with the second overcurrent threshold TH2 to detect an overcurrent flowing into the wire harness 22. The second overcurrent detecting circuit 152 compares an electric current flowing into the wire harness 22 with the second overcurrent threshold TH2. The second overcurrent threshold TH2 being a compared object is a sole difference between the second overcurrent detecting circuit 152 and the first overcurrent detecting circuit 151. That is, the second overcurrent detecting circuit 152 has a structure equivalent to that of the first overcurrent detecting circuit 151 excluding the compared object.

The second overcurrent detecting circuit 152 includes a second comparator 152a, a second overcurrent timer 152b, and a second reset circuit 152c.

The second comparator 152a compares an electric current flowing into the wire harness 22 with the second overcurrent threshold TH2. The second comparator 152a has a noninverting input terminal to input the voltage applied to the switching element 12. The second comparator 152a further has an inverting input terminal to input the second overcurrent threshold TH2 from the threshold circuit 13. The second comparator 152a is further configured to compare the input voltage with the second overcurrent threshold TH2.

The second overcurrent timer 152b measures a time period in which the electric current flowing into the wire harness 22 becomes greater than the second overcurrent threshold TH2. Specifically, the second overcurrent timer 152b measures the time period in which the second overcurrent timer 152b inputs the high-level signal from the second comparator 152a based on a clock signal outputted from the clock 14. The second overcurrent timer 152b outputs a second time-up signal when the measured time period reaches the second overcurrent duration time, which corresponds to the second overcurrent threshold TH2, to cause time out. The second overcurrent duration time is greater than the first overcurrent duration time. The second time-up signal is a high-level signal exhibiting that an overcurrent flows into the wire harness 22. Henceforth, the first overcurrent duration time is denoted by T1, and the second overcurrent duration time is denoted by T2.

Here, the second overcurrent duration time T2 is set to be longer than the first overcurrent duration time T1. The definition of the times T1, T2 is made in consideration that a rush current, which flows into the wire harness 22 on activation of the load element 23 and/or the load element 24, is a momentary current (instant current). Specifically, a rush current has a convex current waveform. When a rush current has a large electric current value, the width of the current waveform of the rush current becomes narrow. That is, a rush current having a large current value flows for a short time period continually. Alternatively, a rush current having a small current value has a wide current waveform. That is, a rush current having a small current value flows for a long time period continually. In view of this, the second overcurrent duration time T2, which corresponds to the second overcurrent threshold TH2 being less than the first overcurrent threshold TH1, is set to be longer than the first overcurrent duration time T1. In this way, a rush current is restricted not to be detected as an overcurrent.

The second reset circuit 152c resets the measured time period of the second overcurrent timer 152b in response to a low-level signal outputted from the second comparator 152a. The second reset circuit 152c is a NOT circuit similarly to the first reset circuit 151c.

An overcurrent determination circuit 16 is configured to cause the control circuit 17 to deactivate (turn OFF) the switching element 12 when an overcurrent flows into the wire harness 22. The overcurrent determination circuit 16 is an OR circuit configured to output a high-level signal when inputting at least one of the first time-up signal and the second time-up signal.

The control circuit 17 is configured to control activation and deactivation of the switching element 12 to control application of the battery voltage to the wire harness 22. Specifically, the control circuit 17 is supplied with electric power of the battery 20 on activation of the electric power switch 21. When being activated, the control circuit 17 is configured to control activation of the switching element 12 to supply electric power of the battery 20 to each of the load elements 23, 24. In this control, the control circuit 17 manipulates a gate voltage of the switching element 12.

The control circuit 17 deactivates the switching element 12 when inputting a high-level signal from the overcurrent determination circuit 16. In this way, the control circuit 17 terminates an overcurrent flowing into the wire harness 22. The above is an entire structure of the switch circuit 10 and the power supply system according to the present embodiment.

Figure 2:
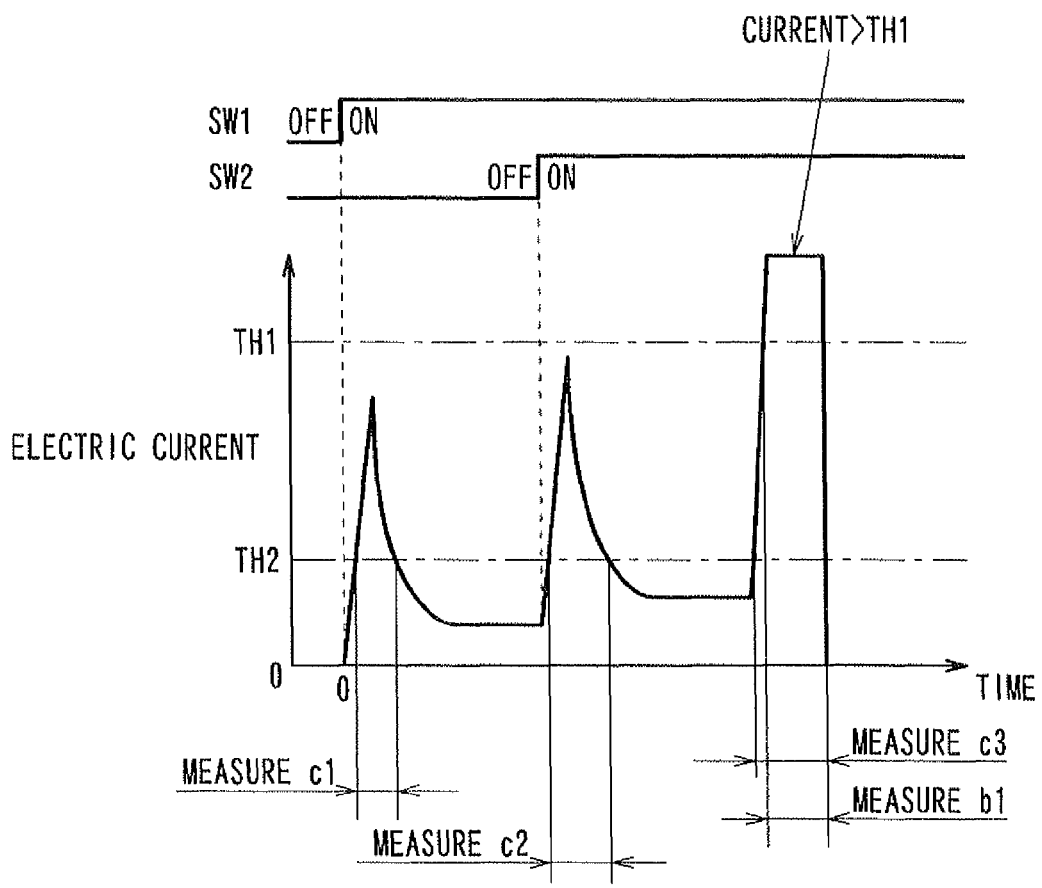
FIG. 2 is a first timing chart showing an operation of the switch circuit.
Figure 3:
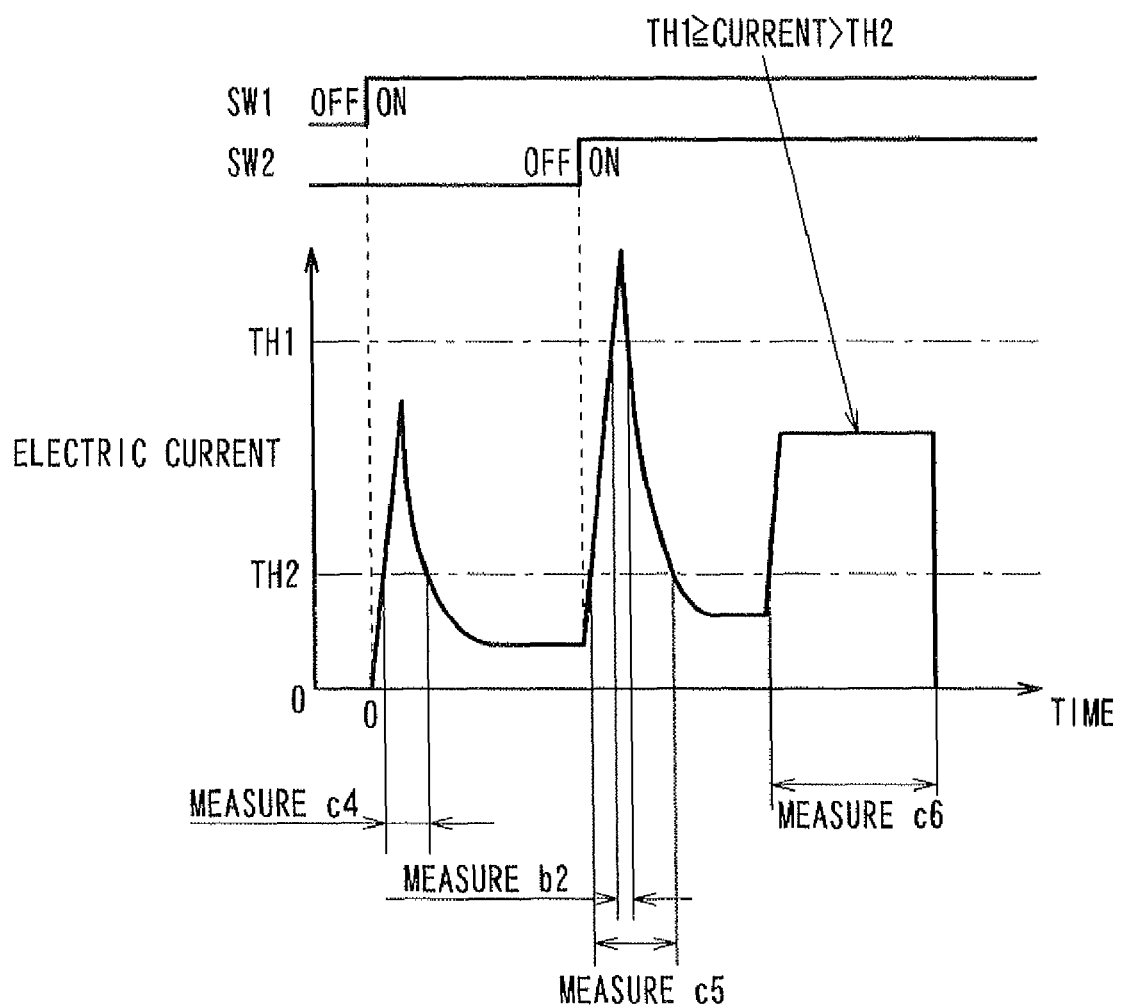
FIG. 3 is a second timing chart showing an operation of the switch circuit.
Figure 4:
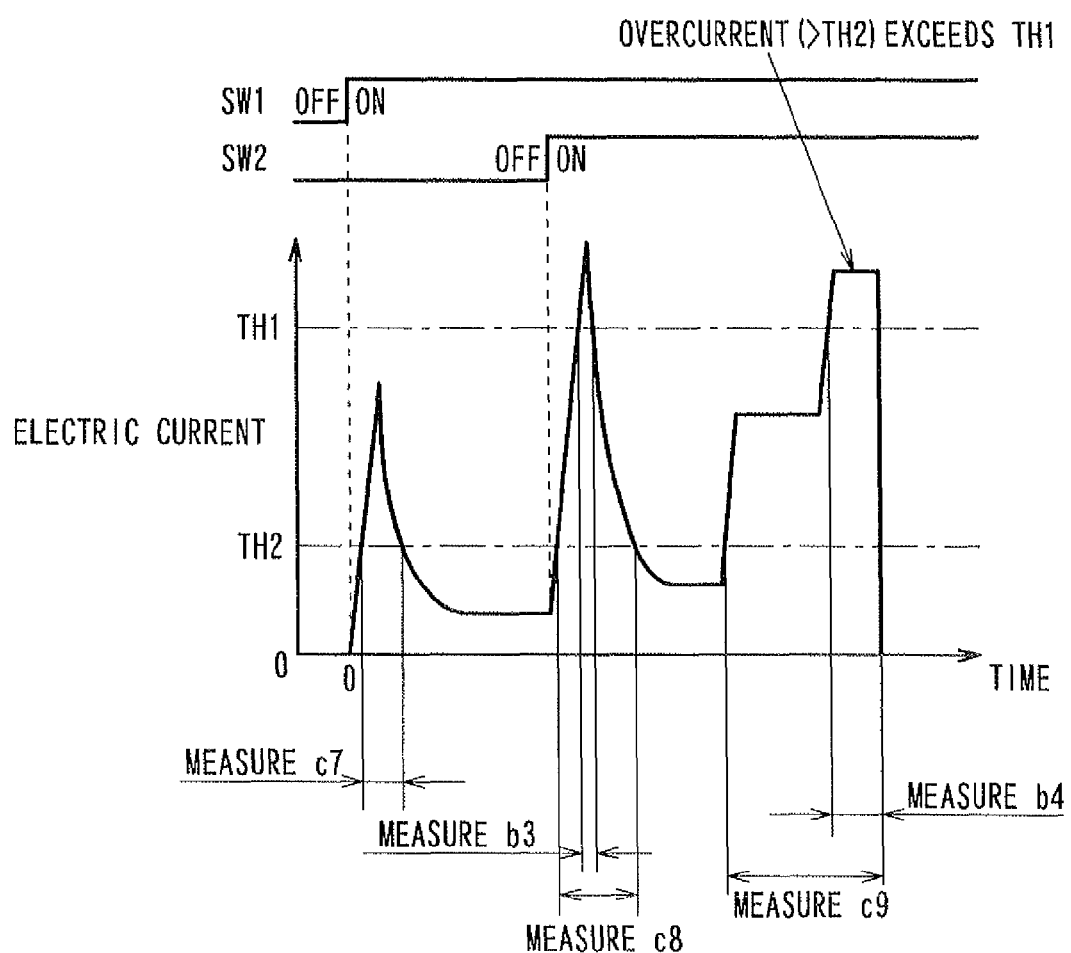
FIG. 4 is a third timing chart showing an operation of the switch circuit.

As follows, an operation of the switch circuit 10 will be described with reference to FIGS. 2 to 4. FIGS. 2 to 4 are timing charts each showing an electric current value when the load element 23 and/or the load element 24 are activated at arbitrary time points. In each timing chart, the horizontal axis shows a time progress, and the vertical axis shows an electric current value of an electric current flowing into the wire harness 22.

First, the case shown in FIG. 2 will be described. As shown in FIG. 2, when the switch device SW1 is activated, a rush current flows into the wire harness 22 in response to the activation. The rush current is greater than the second overcurrent threshold TH2. Therefore, the second overcurrent timer 152b of the second overcurrent detecting circuit 152 measures the duration time c1, in which the rush current flowing into the wire harness 22 is greater than the second overcurrent threshold TH2. The duration time c1 is shorter than the second overcurrent duration time T2. Therefore, the second overcurrent timer 152b does not output the second time-up signal.

The rush current caused by activation of the switch device SW1 is not greater than the first overcurrent threshold TH1. Therefore, the first overcurrent timer 151b of the first overcurrent detecting circuit 151 does not measure the duration time and does not output the first time-up signal.

In this case, the first time-up signal and the second time-up signal being at a high-level signal are not outputted to the overcurrent determination circuit 16. Therefore, the overcurrent determination circuit 16 determines that an overcurrent does not flow into the wire harness 22. In this case, the overcurrent determination circuit 16 outputs a low-level signal to the control circuit 17.

Subsequently, when the switch device SW2 is activated at an arbitrary time point, a rush current flows into the wire harness 22 again. The rush current is greater than the second overcurrent threshold TH2 and is not greater than the first overcurrent threshold TH1, similarly to the above case. Therefore, the duration time c2, in which the rush current is greater than the second overcurrent threshold TH2, is measured. The duration time c2 is shorter than the second overcurrent duration time T2. Therefore, the second overcurrent timer 152b does not output the second time-up signal. In addition, the first overcurrent timer 151b does not output the first time-up signal. Therefore, the overcurrent determination circuit 16 does not determine that an overcurrent flows into the wire harness 22.

Next, subsequent to activation of each of the switch devices SW1, SW2 as described above, an electric current greater than the first overcurrent threshold TH1 flows into the wire harness 22. In this case, the second overcurrent timer 152b measures the duration time c3 in which the electric current is greater than the second overcurrent threshold TH2. In addition, the first overcurrent timer 151b measures the duration time b1 in which the electric current is greater than the first overcurrent threshold TH1.

The duration time c3 is shorter than the second overcurrent duration time T2. Therefore, the second overcurrent timer 152b does not output the second time-up signal. Contrary, the duration time b1 increases to the first overcurrent duration time T1 to cause time out. Therefore, the first overcurrent timer 151b outputs the first time-up signal.

In this way, the overcurrent determination circuit 16 receives the first time-up signal and determines that the an overcurrent flows into the wire harness 22. Thereby, the overcurrent determination circuit 16 outputs a high-level signal to the control circuit 17. In response to the high-level signal from the overcurrent determination circuit 16, the control circuit 17 deactivates the switching element 12 to terminate the overcurrent flowing into the wire harness 22.

Subsequently, the case shown in FIG. 3 will be described. As shown in FIG. 3, when the switch device SW1 is activated, a rush current, which is greater than the second overcurrent threshold TH2 and is not greater than the first overcurrent threshold TH1, flows into the wire harness 22. In this case, the second overcurrent timer 152b measures the duration time c4, in which the rush current is greater than the second overcurrent threshold TH2. The duration time c4 is shorter than the second overcurrent duration time T2. Therefore, the overcurrent determination circuit 16 determines that the overcurrent does not flow into the wire harness 22, similarly to the above case.

Next, subsequent to activation of the switch device SW2 at an arbitrary time point, a rush current greater than the first overcurrent threshold TH1 flows into the wire harness 22. In this case, the second overcurrent timer 152b measures the duration time CS in which the rush current is greater than the second overcurrent threshold TH2. In addition, the first overcurrent timer 151b measures the duration time b2 in which the rush current is greater than the first overcurrent threshold TH1.

The duration time c5 is shorter than the second overcurrent duration time T2. Therefore, the second overcurrent timer 152b does not output the second time-up signal. In addition, the duration time b2 is shorter than the first overcurrent duration time T1. Therefore, the first overcurrent timer 151b does not output the first time-up signal. Therefore, the overcurrent determination circuit 16 does not determine that an overcurrent flows into the wire harness 22.

Next, subsequent to activation of the switch devices SW1, SW2, an electric current, which is greater than the second overcurrent threshold TH2 and is not greater than the first overcurrent threshold TH1, flows into the wire harness 22. In this case, the second overcurrent timer 152b measures the duration time c6, in which the electric current is greater than the second overcurrent threshold TH2. In addition, the first overcurrent timer 151b does not measure a duration time.

Thereafter, the duration time c6 increases to the second overcurrent duration time T2 to cause time out. Thereby, the second overcurrent timer 152b outputs the second time-up signal. In this way, the overcurrent determination circuit 16 receives the second time-up signal and determines that the an overcurrent flows into the wire harness. Thereby, the overcurrent determination circuit 16 causes the control circuit 17 to deactivate the switching element 12. In this way, the control circuit 17 terminates an overcurrent flowing into the wire harness 22.

Subsequently, the case shown in FIG. 4 will be described. As shown in FIG. 4, when the switch device SW1 is activated, a rush current, which is greater than the second overcurrent threshold TH2 and is not greater than the first overcurrent threshold TH1, flows into the wire harness 22. In this case, the second overcurrent timer 152b measures the duration time c7, in which the rush current is greater than the second overcurrent threshold TH2. The duration time c7 is shorter than the second overcurrent duration time T2. Therefore, the overcurrent determination circuit 16 determines that the overcurrent does not flow into the wire harness 22, similarly to the above cases.

Next, when the switch device SW1 is activated at an arbitrary time point subsequent to activation of the switch device SW2, a rush current greater than the first overcurrent threshold TH1 flows into the wire harness 22. In this case, similarly to the above cases, the second overcurrent timer 152b measures the duration time c8 in which the rush current is greater than the second overcurrent threshold TH2. In addition, the first overcurrent timer 151b measures the duration time b3 in which the rush current is greater than the first overcurrent threshold TH1.

The duration time c8 is shorter than the second overcurrent duration time T2. In addition, the duration time b3 is shorter than the first overcurrent duration time T1. Therefore, the second overcurrent timer 152b does not output the second time-up signal. In addition, the first overcurrent timer 151b does not output the first time-up signal. Therefore, the overcurrent determination circuit 16 does not determine that an overcurrent flows into the wire harness 22.

Subsequently, as shown in FIG. 4, an electric current greater than the second overcurrent threshold TH2 flows into the wire harness 22 for more than a certain time period, and thereafter the electric current becomes greater than the first overcurrent threshold TH1. In this case, the second overcurrent timer 152b measures the duration time c9 in which the electric current is greater than the second overcurrent threshold TH2. In addition, the first overcurrent timer 151b measures the duration time b4 in which the electric current is greater than the first overcurrent threshold TH1.

The duration time b4 is shorter than the first overcurrent duration time T1. Therefore, the first overcurrent timer 151b does not output the first time-up signal. Contrary, the duration time c9 increases to the second overcurrent duration time T2 to cause time out. Thereby, the second overcurrent timer 152b outputs the second time-up signal. Therefore, the overcurrent determination circuit 16 determines that an overcurrent flows into the wire harness 22 and causes the control circuit 17 to deactivate the switching element 12. In this way, the control circuit 17 terminates an overcurrent flowing into the wire harness 22.

As described above, in the present embodiment, when an electric current, such as a rush current, flows into the wire harness 22, the duration time, in which the electric current is greater than each of the overcurrent thresholds TH1, TH2, is measured. The overcurrent duration times T1, T2 are respectively set for the overcurrent thresholds TH1, TH2. When the duration time increases to the corresponding one of the overcurrent duration times T1, T2 to cause time out, it is determined that an overcurrent flows into the wire harness 22 to deactivate the switching element 12. In this way, even when each of the load elements 23, 24 is activated at an arbitrary time point to cause a rush current flowing into the wire harness 22, the rush current can be restricted from being detected as an overcurrent.

(Second Embodiment)

As follows, subjects different from those in the first embodiment will be mainly described. In the above-described first embodiment, an electric current flowing into the wire harness 22 is compared with each of the two overcurrent thresholds. Contrary, according to the present embodiment, multiple overcurrent thresholds are set, and an electric current flowing into the wire harness 22 is compared with each of the overcurrent thresholds.

Figure 5:
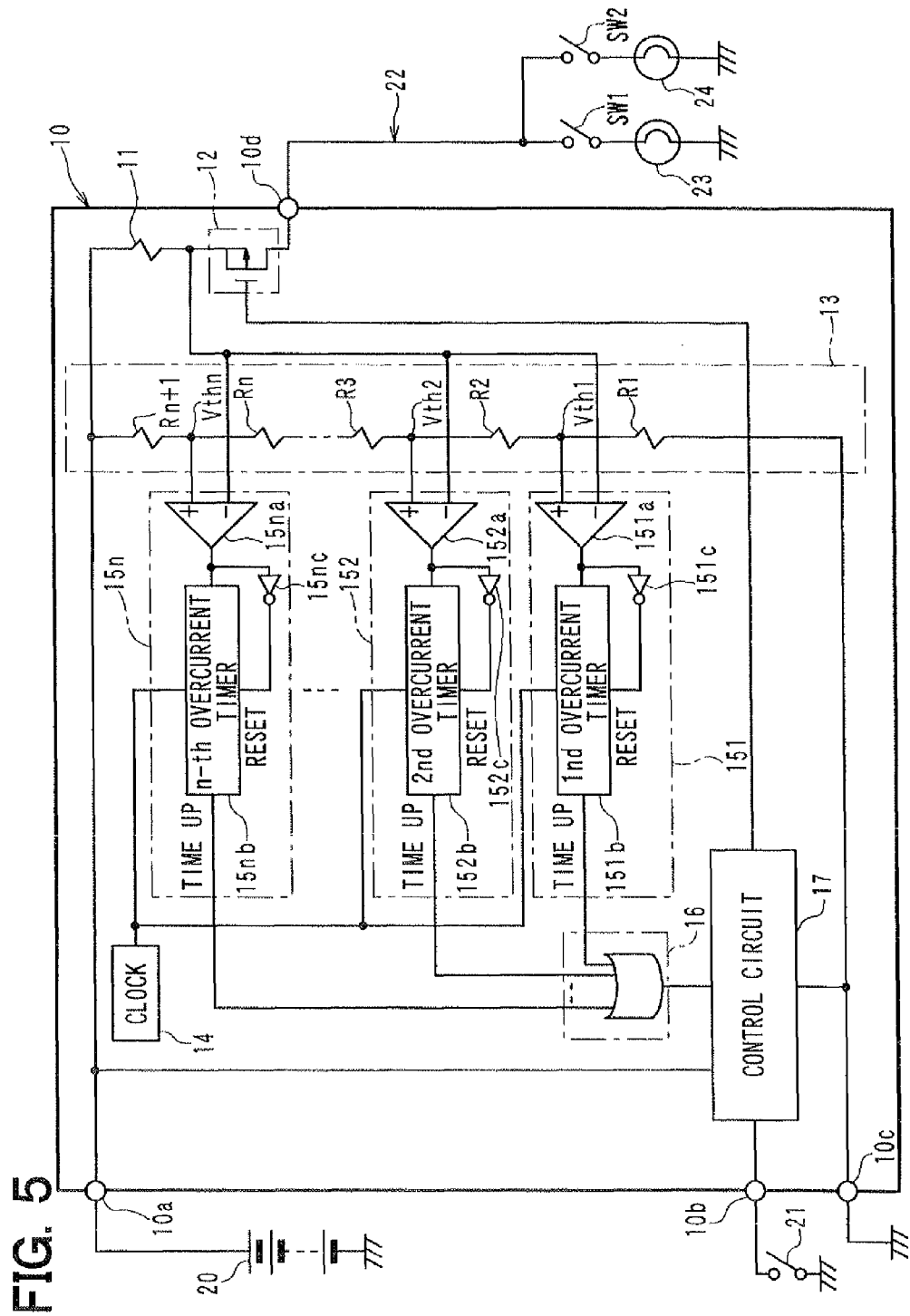
FIG. 5 is an overview showing a power supply system including a switch circuit according to a second embodiment of the present invention.

FIG. 5 is an overview showing a power supply system including a switch circuit 10 according to the present embodiment. The shunt resistor 11, the switching element 12, the clock 14, the overcurrent determination circuit 16, and the control circuit 17 equipped in the switch circuit 10 are equivalent to those in the first embodiment.

As shown in FIG. 5, the threshold circuit 13 includes multiple resistor elements R1 to Rn+1. Overcurrent threshold voltages (Vth1 to Vthn) at connecting points of the resistor elements R1 to Rn+1 are respectively set to overcurrent thresholds. Specifically, the overcurrent thresholds (TH1 to THn) from the first overcurrent threshold TH1 to the n-th overcurrent threshold THn are set to have values, which become smaller in order.

The switch circuit 10 includes first to n-th overcurrent detecting circuits 151 to 15n. The overcurrent detecting circuits 151 to 15n respectively correspond to the overcurrent thresholds TH1 to THn of the threshold circuit 13. Each of the overcurrent detecting circuits 151 to 15n has a structure equivalent to the structure shown in the first embodiment. In the present embodiment, the overcurrent timers 151b to 15nb of the overcurrent detecting circuits 151 to 15n are respectively assigned with the first to n-th overcurrent duration times T1 to Tn The first to n-th overcurrent duration times T1 to Tn are set to have values, which become larger in order. The set values of the first to n-th overcurrent duration times T1 to Tn are attributed to the values of the overcurrent thresholds (TH1 to THn) set to become smaller in order.

The overcurrent determination circuit 16 is configured to receive either of the first to n-th time-up signals outputted from the overcurrent detecting circuits 151 to 15n. On receiving at least one of the first to n-th time-up signals, the overcurrent determination circuit 16 determines that an overcurrent flows into the wire harness 22 and cause the control circuit 17 to deactivate the switching element 12.

As described above, in the present embodiment, accuracy of overcurrent detection can be enhanced by setting multiple overcurrent thresholds. That is, determination whether an electric current flowing into the wire harness 22 is a rush current or an overcurrent can be made with sufficient accuracy.

(Third Embodiment)

As follows, subjects different from those in the first and second embodiments will be mainly described. In the second embodiment, the multiple overcurrent detecting circuits 151 to 15n are provided in order to enhance accuracy of overcurrent detection. In this case, the n units of comparators and overcurrent timers are needed, and the switch circuit 10 is enlarged.

In view of this, a configuration of the switch circuit 10 with multiple overcurrent detecting circuits is employed. The configuration enables to regulate the circuit scale not to be large.

Figure 6:
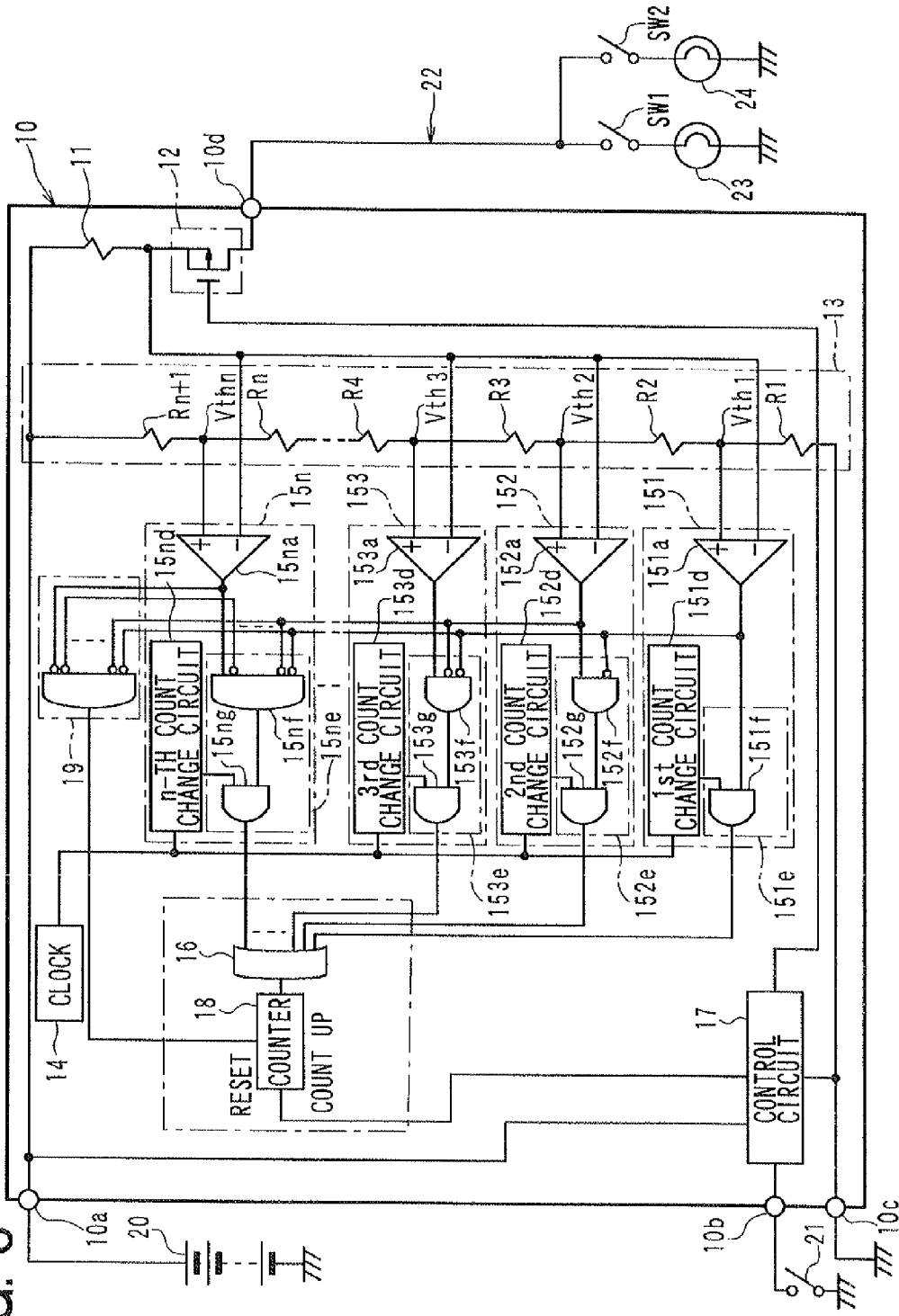
FIG. 6 is an overview showing a power supply system including a switch circuit according to a third embodiment of the present invention.

FIG. 6 is an overview showing a power supply system including a switch circuit 10 according to the present embodiment. The structure of the threshold circuit 13 provided to the switch circuit 10 is equivalent to that shown in the second embodiment. Specifically, the threshold circuit 13 causes the multiple resistor elements R1 to Rn+1 connected in series to generate the divided voltages to set the first overcurrent threshold voltage Vth1 to the n-th overcurrent threshold voltage Vthn such that the first overcurrent threshold TH1 to the n-th overcurrent threshold THn have values, which become smaller in order. The shunt resistor 11, the switching element 12, the clock 14, and the control circuit 17 equipped in the switch circuit 10 are equivalent to those in the first embodiment.

As shown in FIG. 6, the switch circuit 10 includes multiple overcurrent detecting circuits 151 to 15n, the overcurrent determination circuit 16, a counter 18, and a counter reset condition determination circuit 19.

According to the present embodiment, the overcurrent detecting circuits 151 to 15n are respectively provided for the overcurrent thresholds TH1 to THn. In addition, a cycle at which the value becomes large in order, is set correspondingly to the overcurrent thresholds TH1 to THn. According to an electric current flowing into the wire harness 22 and corresponding overcurrent thresholds TH1 to THn, the overcurrent detecting circuits 151 to 15n are configured to output comparison results that an electric current flowing into the wire harness 22 is greater than the overcurrent thresholds TH1 to THn at a cycle corresponding to the overcurrent thresholds TH1 to THn.

The overcurrent detecting circuits 151 to 15n respectively include comparators 151a to 15na, count time change circuits 151d to 15nd, and counter time select circuits 151e to 15ne.

Similarly to the second embodiment, the comparators 151a to 15na are configured to respectively compare the overcurrent thresholds TH1 to THn corresponding to the overcurrent detecting circuits 151 to 15n with an electric current flowing into the wire harness 22.

The count time change circuits 151d to 15nd are configured to output a pulse respectively at cycles corresponding to the overcurrent detecting circuits 151 to 15n. The pulse is a high-level signal. Specifically, the count time change circuits 151d to 15nd respectively generate pulses at a first cycle to an n-th cycle corresponding to the overcurrent detecting circuits 151 to 15n by using a clock signal outputted from the clock 14. That is, each of the count time change circuits 151d to 15nd functions as a count down circuit configured to count-down the clock signals.

The counter time select circuits 151e to 15ne are respectively configured to output the output signals of the comparators 151a to 15na from the overcurrent detecting circuits 151 to 15n according to output signals of the count time change circuits 151d to 15nd. Specifically, the counter time select circuits 151e to 15ne respectively output comparison results that an electric current flowing into the wire harness 22 is greater than the overcurrent thresholds TH1 to THn when respectively inputting both: comparison results respectively from the comparators 151a to 15na that an electric current flowing into the wire harness 22 is greater than the overcurrent thresholds TH1 to THn: and pulses respectively from the count time change circuits 151d to 15nd.

The counter time select circuits 151e to 15ne include, for example, AND circuit(s). Specifically, for example, the first counter time select circuit 151e corresponding to the first overcurrent threshold TH1, which has the greatest value, includes a single AND circuit 151f.

The AND circuit 151f outputs a high-level signal when inputting both a high-level signal from the first comparator 151a and a pulse from the first count time change circuit 151d.

The second counter time select circuit 152e corresponding to the second overcurrent threshold TH2 includes two AND circuits 152f, 152g. The AND circuit 152f inputs both an inverted output signal from the first comparator 151a and an output signal from the second comparator 152a. In the present configuration, the AND circuit 152f outputs a high-level signal when the first comparator 151a outputs a low-level signal and when the second comparator 152a outputs a high-level signal. The AND circuit 152g outputs a high-level signal when inputting both a high-level signal from the AND circuit 152f and a pulse from the second count time change circuit 152d.

In the present structure, the second counter time select circuit 152e is configured to output its comparison result that an electric current flowing into the wire harness 22 is greater than the second overcurrent threshold TH2 when not inputting a high-level signal from the first overcurrent detecting circuit 151.

The third counter time select circuit 153e corresponding to the third overcurrent threshold TH3 includes two AND circuits 153f, 153g. The AND circuit 153f inputs both an inverted output signals from the first comparator 151a and the second comparator 152a and an output signal from the third comparator 153a. In the present configuration, the AND circuit 153f outputs a high-level signal when both the first comparator 151a and the second comparator 152a output low-level signals and the third comparator 153a outputs a high-level signal. The AND circuit 153g outputs a high-level signal when inputting both a high-level signal from the AND circuit 153f and a pulse from the third count time change circuit 153d.

Each of other counter time select circuits up to the n-th counter time select circuit 15ne including an AND circuit 15nf and an AND circuit 15ng has an equivalent structure. According to the above-described structure, one overcurrent detecting circuit corresponding to one overcurrent threshold among the overcurrent thresholds TH1 to THn outputs a comparison result that an electric current flowing into the wire harness 22 is greater than the one overcurrent threshold at a cycle corresponding to the one overcurrent detecting circuit, only when another overcurrent detecting circuit corresponding to another overcurrent threshold greater than the one overcurrent threshold outputs a comparison result that an electric current flowing into the wire harness 22 does not exceed the greater overcurrent threshold.

In other words, when an electric current greater than one smaller overcurrent threshold of two overcurrent thresholds flows into the wire harness 22, one overcurrent detecting circuit corresponding to the smaller overcurrent threshold outputs a comparison result at a longer cycle corresponding to the smaller overcurrent threshold. On the other hand, when an electric current greater than the greater overcurrent threshold of the two overcurrent thresholds flows, the overcurrent detecting circuit corresponding to the greater overcurrent threshold outputs a comparison result that an electric current flowing into the wire harness 22 is greater than the greater overcurrent threshold at a shorter cycle corresponding to the greater overcurrent threshold. In addition, the overcurrent detecting circuit corresponding to the smaller overcurrent threshold does not output a comparison result that an electric current flowing into the wire harness 22 is greater than the smaller overcurrent threshold.

The overcurrent determination circuit 16 outputs a high-level signal to the counter 18 when inputting a high-level signal from the overcurrent detecting circuits 151 to 15n. The condition where the overcurrent detecting circuits 151 to 15n outputs a high-level signal exhibits that an electric current different from a normal electric current flows into the wire harness 22.

The counter 18 is configured to count the number of high-level signals outputted from the overcurrent determination circuit 16. The counter 18 is further configured to cause the control circuit 17 to deactivate the switching element 12 when the total counted number (count value) increases to a count-up value to determine that an overcurrent flows into the wire harness 22.

The counter reset condition determination circuit 19 is configured to reset the count value of the counter 18 when a predetermined condition is satisfied. The predetermined condition is satisfied when the counter reset condition determination circuit 19 inputs comparison results from all the comparators 151a to 15na that an electric current flowing into the wire harness 22 is not greater than the overcurrent thresholds TH1 to THn. That is, the predetermined condition is satisfied when all the comparators 151a to 15na does not output high-level signals. In other words, the predetermined condition is satisfied when all the comparators 151a to 15na output low-level signals. In such a condition, an abnormally high electric current does not flow into the wire harness 22 or completes flowing into the wire harness 22. When the predetermined condition is satisfied, overcurrent detection is not performed. Therefore, the counter reset condition determination circuit 19 resets the count value of the counter 18. The above is the configuration of the switch circuit 10 according to the present embodiment.

As follows, an operation of the switch circuit 10 will be described with reference to a timing chart shown in FIG. 7. As follows, an operation of the switch circuit 10 provided with first to third overcurrent detecting circuits 151 to 153 will be described.

When the switch device SW1 is activated, a rush current flows into the wire harness 22 in response to the activation. The rush current becomes greater than the third overcurrent threshold TH3 at a time point U1. Thus, as shown in FIG. 7, the third comparator 153a outputs a high-level signal. The rush current is not greater than the second overcurrent threshold TH2 and the first overcurrent threshold TH1. Therefore, the second comparator 152a and the first comparator 151a output low-level signals.

In this way, the third counter time select circuit 153e of the third overcurrent detecting circuit 153 outputs a high-level signal at a third cycle in response to a pulse outputted from the third count time change circuit 153d. The overcurrent determination circuit 16 outputs a high-level signal to the counter 18 at the third cycle on inputting the high-level signal from the third overcurrent detecting circuit 153 at the third cycle. Thereby, the counter 18 counts the number of the high-level signals outputted at the third cycle from the overcurrent determination circuit 16.

The counter reset condition determination circuit 19 inputs a high-level signal from the first comparator 151a. Therefore, the count value of the counter 18 is not reset.

Figure 7:
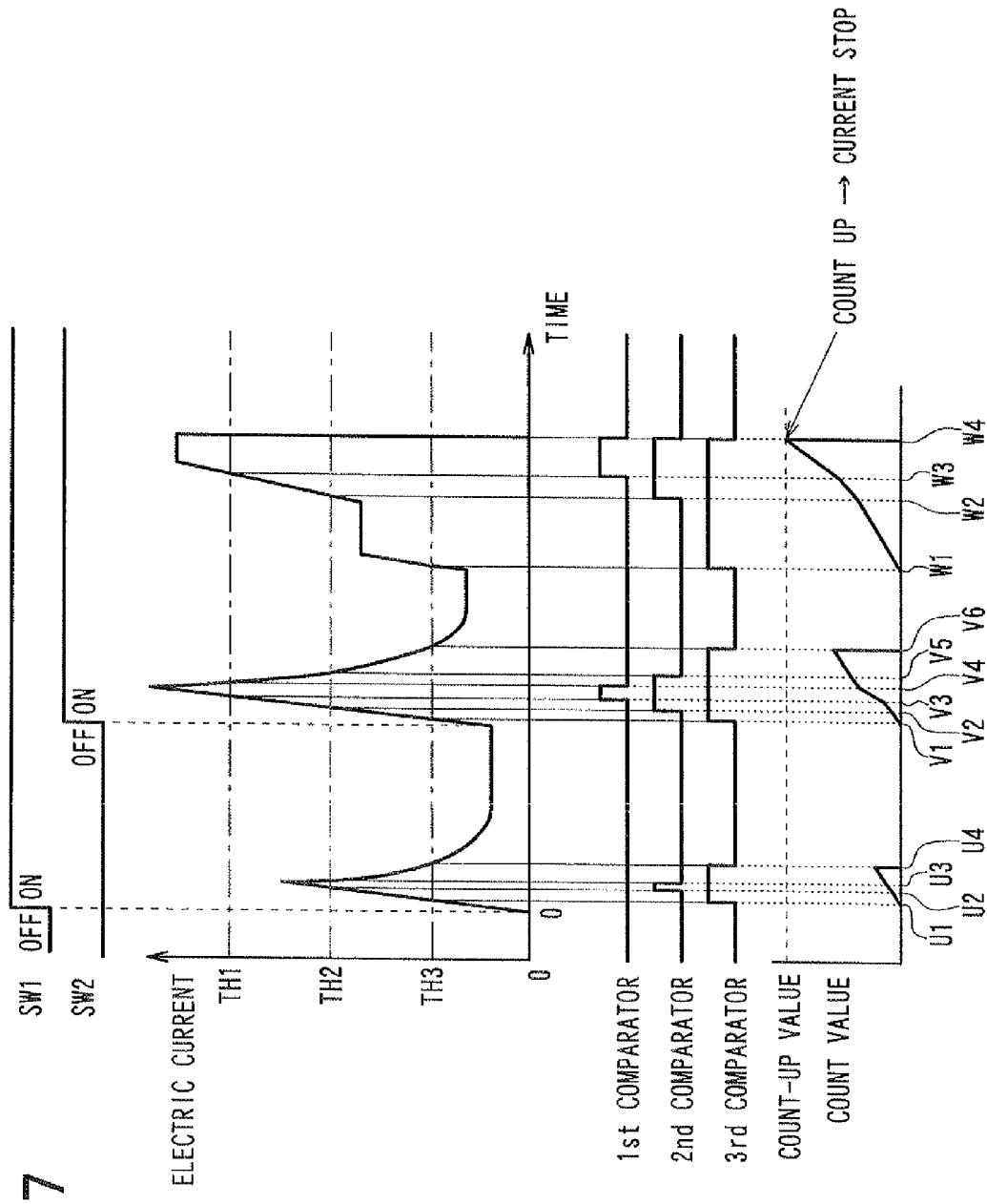
FIG. 7 is a fourth timing chart showing an operation of the switch circuit according to the third embodiment.

Subsequently, as shown in FIG. 7, when a rush current becomes greater than the second overcurrent threshold TH2 at a time point U2, the second comparator 152a outputs a high-level signal. At this time, the third comparator 153a also outputs a high-level signal. Nevertheless, since the second comparator 152a outputs the high-level signal, the AND circuit 153f of the third counter time select circuit 153e no longer outputs the high-level signal. Therefore, only the second counter time select circuit 152e outputs the high-level signal at a second cycle. Thus, the counter 18 adds the high-level signals outputted through the overcurrent determination circuit 16 at the second cycle to the present count value.

Subsequently, at a time point U3, the rush current becomes less than the second overcurrent threshold TH2, and the switch circuit 10 performs the same operation as that between the time points U1 and U2. Specifically, the counter 18 adds the high-level signals outputted at the third cycle from the overcurrent determination circuit 16 to the present count value.

The rush current becomes less than the third overcurrent threshold TH3 at a time point U4. The count value at the time point U4 does not reach the count-up value. Therefore, the control circuit 17 does not deactivate the switching element 12. All the first to third comparators 151a to 153a output low-level signals to cause the counter reset condition determination circuit 19 to reset the count value of the counter 18.

Subsequently, when the switch device SW2 is activated at an arbitrary time point, a rush current becomes greater than the third overcurrent threshold TH3 at a time point V1. Subsequently, the rush current becomes greater than the second overcurrent threshold TH2 at a time point V2 subsequent to the time point V1. In this case, in the time period between the time points V1, V2, the counter 18 does a count operation equivalent to that in the time period between the time points U1, U2. In this case, in the time period between the time points V2, V3, the counter 18 does a count operation equivalent to that in the time period between the time points U2, U3.

Subsequently, as shown in FIG. 7, when the rush current becomes greater than the first overcurrent threshold TH1 at the time point V3, the first comparator 151a outputs a high-level signal. At this time, the third comparator 153a and the second comparator 152a also output high-level signals. Nevertheless, since the first comparator 151a outputs the high-level signal, the AND circuit 153f of the third counter time select circuit 153e and the AND circuit 152f of the second counter time select circuit 152e no longer output the high-level signals. Therefore, only the first counter time select circuit 151e outputs the high-level signal at a first cycle. Thus, the counter 18 adds the high-level signals outputted through the overcurrent determination circuit 16 at the first cycle to the present count value.

The first cycle is shorter than the third cycle. Therefore, as the time period in which an abnormally high electric current is greater than the first overcurrent threshold TH1 becomes long, an increasing rate of the count value of the counter 18 becomes high. That is, inclination of the count value at the third cycle is the smallest, and inclination of the count value at the first cycle is the largest. It is noted that the time period in which the rush current is greater than the first overcurrent threshold TH1 is short. Therefore, even when inclination of the count value of the counter 18 at the first cycle is large, the total count value does not quickly increase.

When the rush current reaches the maximum value, the rush current subsequently starts decreasing quickly. Thereafter, the rush current first becomes less than the first overcurrent threshold TH1 at a time point V4. At this time, the rush current is still greater than the second overcurrent threshold TH2. Therefore, a count operation equivalent to that in the time period between the time points V2, V3 is performed to increase the count value of the counter 18. Thereafter, the rush current becomes less than the second overcurrent threshold TH2 at a time point V5. At this time, the rush current is still greater than the third overcurrent threshold TH3. Therefore, a count operation equivalent to that in the time period between the time points V1, V2 is performed to further increase the count value of the counter 18.

When the rush current becomes less than the third overcurrent threshold TH3 at the time point V6, the third overcurrent detecting circuit 153 no longer outputs the high-level signal. Therefore, the count operation of the counter 18 is terminated. The present count value does not reach the count-up value. Therefore, the control circuit 17 does not deactivate the switching element 12. The counter reset condition determination circuit 19 resets the count value of the counter 18.

Subsequently, as shown in FIG. 7, the switch devices SW1, SW2 are activated similarly to the above-described manner, and an abnormal electric current begins to flow into the wire harness 22 at an arbitrary time point. When the abnormal electric current becomes greater than the third overcurrent threshold TH3 at a time point W1, the third comparator 153a outputs a high-level signal. Thereby, the counter 18 counts the high-level signals outputted at the third cycle from the overcurrent determination circuit 16.

After the time point W1, the abnormal electric current becomes constant once and increases again. At the time point W2, the abnormal electric current becomes greater than the second overcurrent threshold TH2. As shown in FIG. 7, the second comparator 152a outputs a high-level signal. Therefore, the counter 18 adds the high-level signal outputted at the second cycle from the overcurrent determination circuit 16 to the count value.

At the time point W3, the abnormal electric current becomes greater than the first overcurrent threshold TH1. As shown in FIG. 7, the first comparator 151a outputs a high-level signal. Therefore, the counter 18 adds the high-level signal outputted at the first cycle from the overcurrent determination circuit 16 to the count value.

As described above, inclination of the count value at the first cycle is the largest. Therefore, when the abnormal electric current is continually in the condition subsequent to the time point W3, the count value of the counter 18 quickly increases to the count-up value. Thus, the counter 18 causes the control circuit 17 to deactivate the switching element 12. As a result, the electric current of the wire harness 22 is terminated at the time point W4.

Termination of the electric current flowing into the wire harness 22 causes all the first to third comparators 151a to 153a to output low-level signals. Thereby, the counter reset condition determination circuit 19 outputs a high-level signal to reset the count value of the counter 18 to 0. In this way, an abnormal electric current flowing into the wire harness 22 at an arbitrary time point can be terminated.

As described above, in the present embodiment, a counter 18 is provided to count output signals from the overcurrent detecting circuits 151 to 15n. Thereby, the overcurrent detecting circuits 151 to 15n need not be provided with timers. Accordingly, the circuit scale of the switch circuit 10 shown in FIG. 6 can be reduced compared with the switch circuit 10 shown in FIG. 5.

The counter 18 and the overcurrent determination circuit 16 may function as a counter.

(Other Embodiment)

In the above embodiments, the switch circuit 10 is applied to the wire harness 22 connected with two load elements 23, 24. Alternatively, the switch circuit 10 may be applied to the wire harness 22 connected with three or more load elements.

In the third embodiment, the overcurrent detecting circuits 151 to 15n are respectively provided with the count time change circuits 151d to 15nd. It is noted that each of the count time change circuits 151d to 15nd may be modified to count down an output signal of a preceding count time change circuit. Thereby, the overcurrent detecting circuits 151 to 15n need not be respectively provided with the count time change circuit 151d to 15nd having the same configurations. Accordingly, the circuit scale of the switch circuit 10 can be further reduced.

In the third embodiment, the switch circuit 10 is provided with the overcurrent detecting circuits 151 to 15n, as an example. It is noted that at least two overcurrent detecting circuits may suffice the configuration of the third embodiment.

Summarizing the above embodiments, the switch circuit includes: a threshold circuit 13 assigned with a first overcurrent threshold TH1 and a second overcurrent threshold TH2, which is less than the first overcurrent threshold TH1; a first overcurrent detecting circuit 151 configured to: measure a time period, in which an electric current flowing into the wire harness 22 is greater than the first overcurrent threshold TH1, according to the electric current flowing into the wire harness 22 and the first overcurrent threshold TH1; and output a first time-up signal exhibiting an overcurrent when the measured time period reaches a first overcurrent duration time T1, which corresponds to the first overcurrent threshold TH1; and a second overcurrent detecting circuit 152 configured to: measure a time period, in which an electric current flowing into the wire harness 22 is greater than the second overcurrent threshold TH2, according to the electric current flowing into the wire harness 22 and the second overcurrent threshold TH2; and output a second time-up signal exhibiting an overcurrent when the measured time period reaches a second overcurrent duration time T2, which corresponds to the second overcurrent threshold TH2, the second overcurrent duration time T2 being longer than the first overcurrent duration time T1.

The switch circuit further includes an overcurrent determination circuit 16 configured to determine that an overcurrent flows into the wire harness 22 and cause a control circuit 17 to deactivate the switching element 12 when inputting at least one of the first time-up signal and the second time-up signal.

A rush current caused on activation of a load element 23, 24 is a large and instant electric current caused subsequent to activation of the load element 23, 24. Therefore, a time period, in which a rush current is greater than the relatively small second overcurrent threshold TH2, is shorter than the second overcurrent duration time T2, which is relatively long.

In addition, a time period, in which a rush current is greater than the relatively large first overcurrent threshold TH1, is also shorter than the first overcurrent duration time T1, which is relatively short. Therefore, when a time period, in which an electric current flowing into the wire harness 22 is greater than the second overcurrent threshold TH2, reaches the second overcurrent duration time T2 or when a time period, in which the electric current is greater than the first overcurrent threshold TH1, reaches the first overcurrent duration time T1, it can be determined that an overcurrent flows into the wire harness 22. In this way, even when each of the multiple load elements 23, 24 is activated at an arbitrary time point to cause a rush current flowing into the wire harness 22, the rush current can be restricted from being detected as an overcurrent.

The threshold circuit 13 may include multiple resistor elements R1 to R3 connected in series. The threshold circuit 13 may be configured to cause the multiple resistor elements R1 to R3 to generate divided voltages including a first overcurrent threshold voltage Vth1 and a second overcurrent threshold voltage Vth2, which respectively correspond to the first overcurrent threshold TH1 and the second overcurrent threshold TH2.

The first overcurrent detecting circuit 151 may include; a first comparator 151a configured to compare the first overcurrent threshold TH1 with an electric current flowing into the wire harness 22; and a first overcurrent timer 151b configured to: measure a time period in which an electric current flowing into the wire harness 22 is greater than the first overcurrent threshold TH1 according to a comparison result of the first comparator 151a; and output a first time-up signal when the measured time period reaches the first overcurrent duration time T1 and cause a time out.

The second overcurrent detecting circuit 152 may include: a second comparator 152a configured to compare the second overcurrent threshold TH2 with an electric current flowing into the wire harness 22; and a second overcurrent timer 152b configured to: measure a time period in which an electric current flowing into the wire harness 22 is greater than the second overcurrent threshold TH2 according to a comparison result of the second comparator 152a; and output a second time-up signal when the measured time period reaches the second overcurrent duration time T2 and cause a time out.

The switch circuit may further include: a first reset circuit 151c configured to reset measurement of the time period of the first overcurrent timer 151b when an electric current flowing into the wire harness 22 is less than the first overcurrent threshold TH1 according to the comparison result of the first comparator 151a; and a second reset circuit 152c configured to reset measurement of the time period of the second overcurrent timer 152b when an electric current flowing into the wire harness 22 is less than the second overcurrent threshold TH2 according to the comparison result of the second comparator 152a.

In the present structure, either or both of the overcurrent timers 151b, 152b can be reset whenever an abnormal electric current completes flowing into the wire harness 22.

The switch circuit may further include: a threshold circuit 13 assigned with a first overcurrent threshold TH1 and a second overcurrent threshold TH2, which is less than the first overcurrent threshold TH1; a first overcurrent detecting circuit 151 configured to output a comparison result that an electric current flowing into the wire harness 22 is greater than the first overcurrent threshold TH1 at a first cycle, which corresponds to the first overcurrent threshold TH1, according to the electric current flowing into the wire harness 22 and the first overcurrent threshold TH1; a second overcurrent detecting circuit 2 configured to output a comparison result that an electric current flowing into the wire harness 22 is greater than the second overcurrent threshold TH2 at a second cycle, which corresponds to the second overcurrent threshold TH2 and is greater than the first cycle, according to the electric current flowing into the wire harness 22 and the second overcurrent threshold TH2; and a counter 16, 18 configured to: count output signals of each of the first overcurrent detecting circuit 151 and the second overcurrent detecting circuit 152; and determine that an overcurrent flows into the wire harness 22 to cause the control circuit 17 to deactivate the switching element 12 when a total count value reaches a count-up value.

The second overcurrent detecting circuit 152 is configured not to output a comparison result that an electric current flowing into the wire harness 22 is greater than the second overcurrent threshold TH2 when the first overcurrent detecting circuit 151 outputs a comparison result that the electric current flowing into the wire harness 22 is greater than the first overcurrent threshold TH1.

In the present structure, a time period, in which an electric current flowing into the wire harness 22 is greater than the overcurrent threshold TH1, TH2, is counted to obtain a count value of output signals of the overcurrent detecting circuit 151, 152. When the count value does not reach the count-up value, which exhibits an abnormal electric current, a momentary rush current caused by activation of the load element 23, 24 is not detected as an abnormal electric current. In this way, even when a rush current flows into the wire harness 22 at an arbitrary time point, the rush current can be restricted from being detected as an overcurrent.

Furthermore, each overcurrent detecting circuit 151 to 15n need not be provided with an overcurrent timer. Therefore, the circuit scale of the switch circuit can be reduced.

The threshold circuit 13 may include multiple resistor elements R1 to R3 connected in series. The threshold circuit 13 may be configured to cause the multiple resistor elements R1 to R3 to generate divided voltages including a first overcurrent threshold voltage Vth1 and a second overcurrent threshold voltage Vth2, which respectively correspond to the first overcurrent threshold TH1 and the second overcurrent threshold TH2.

The first overcurrent detecting circuit 151 may include: a first comparator 151a configured to compare the first overcurrent threshold TH1 with an electric current flowing into the wire harness 22; a first count time change circuit 151d configured to output a pulse at a first cycle; and a first counter time select circuit 151e configured to output a comparison result that an electric current flowing into the wire harness 22 is greater than the first overcurrent threshold TH1 when inputting both: a comparison result from the first comparator 151a that the electric current flowing into the wire harness 22 is greater than the first overcurrent threshold TH1: and a pulse from the first count time change circuit 151d.

The second overcurrent detecting circuit 152 may include: a second comparator 152a configured to compare the second overcurrent threshold TH2 with an electric current flowing into the wire harness 22; a second count time change circuit 152d configured to output a pulse at a second cycle; and a second counter time select circuit 152e configured to output a comparison result that an electric current flowing into the wire harness 22 is greater than the second overcurrent threshold TH2 when inputting both: a comparison result from the second comparator 152a that the electric current flowing into the wire harness 22 is greater than the second overcurrent threshold TH2: and a pulse from the second count time change circuit 152d.

The second counter time select circuit 152e may be configured to input a comparison result from the first comparator 151a. The second overcurrent detecting circuit 152 may be configured not to output a comparison result that an electric current flowing into the wire harness 22 is greater than the second overcurrent threshold TH2 when inputting a comparison result from the first comparator 151a that the electric current flowing into the wire harness 22 is greater than the first overcurrent threshold TH1.

In the present structure, when an electric current greater than the smaller overcurrent threshold among the overcurrent thresholds TH1, TH2 flows, output signals from the second overcurrent detecting circuit 152 at the second cycle corresponding to the smaller overcurrent threshold can be counted. Alternatively, when an electric current greater than the larger overcurrent threshold among the overcurrent thresholds TH1, TH2 flows, output signals from the first overcurrent detecting circuit 151 at the first cycle corresponding to the larger overcurrent threshold can be counted.

The switch circuit may further include: a counter reset condition determination circuit 19 configured to reset the count value of the counter 16, 18 when an electric current flowing into the wire harness 22 is not greater than both the first overcurrent threshold TH1 and the second overcurrent threshold TH2.

In the present structure, the count value of the counter 16, 18 can be reset whenever an abnormal electric current completes flowing into the wire harness 22. Thus, the count value can be newly counted whenever an abnormal electric current flows at an arbitrary time point.

It should be appreciated that while the processes of the embodiments of the present invention have been described herein as including a specific sequence of steps, further alternative embodiments including various other sequences of these steps and/or additional steps not disclosed herein are intended to be within the steps of the present invention.

Various modifications and alternations may be diversely made to the above embodiments without departing from the spirit of the present invention.

What is claimed is:

1. A switch circuit having an overcurrent detection function for detecting an overcurrent flowing into a single wire harness, which is connected with a plurality of load elements equipped to a vehicle, the switch circuit comprising:
   a switching element connected to the wire harness;
   a control circuit configured to control activation and deactivation of the switching element;
   a threshold circuit assigned with a first overcurrent threshold and a second overcurrent threshold, the second overcurrent threshold being less than the first overcurrent threshold;
   a first overcurrent detecting circuit configured to:
      measure a time period, in which an electric current flowing into the wire harness is greater than the first overcurrent threshold, according to the electric current flowing into the wire harness and the first overcurrent threshold; and
      output the first time-up signal exhibiting an overcurrent when the measured time period reaches a first overcurrent duration time, which corresponds to the first overcurrent threshold;
   a second overcurrent detecting circuit configured to:
      measure a time period, in which an electric current flowing into the wire harness is greater than the second overcurrent threshold, according to the electric current flowing into the wire harness and the second overcurrent threshold; and
      output a second time-up signal exhibiting an overcurrent when the measured time period reaches a second overcurrent duration time, which corresponds to the second overcurrent threshold, the second overcurrent duration time being longer than the first overcurrent duration time;

an overcurrent determination circuit configured to determine that an overcurrent flows into the wire harness and cause a control circuit to deactivate the switching element when inputting at least one of the first time-up signal and the second time-up signal, wherein the threshold circuit includes a plurality of resistor elements connected in series, the threshold circuit is configured to cause the plurality of resistor elements to generate divided voltages including a first overcurrent threshold voltage and a second overcurrent threshold voltage, which respectively correspond to the first overcurrent threshold and the second overcurrent threshold, the first overcurrent detecting circuit includes:
 a first comparator configured to compare the first overcurrent threshold with an electric current flowing into the wire harness; and
 a first overcurrent timer configured to measure a time period in which an electric current flowing into the wire harness is greater than the first overcurrent threshold according to a comparison result of the first comparator and output a first time-up signal when the measured time period reaches the first overcurrent duration time to cause a time out, the second overcurrent detecting circuit includes:
 a second comparator configured to compare the second overcurrent threshold with an electric current flowing into the wire harness; and
 a second overcurrent timer configured to measure a time period in which an electric current flowing into the wire harness is greater than the second overcurrent threshold according to a comparison result of the second comparator and output a second time-up signal when the measured time period reaches the second overcurrent duration time to cause a time out;

a first reset circuit configured to reset measurement of the time period of the first overcurrent timer when an electric current flowing into the wire harness is less than the first overcurrent threshold according to the comparison result of the first comparator; and a second reset circuit configured to reset measurement of the time period of the second overcurrent timer when an electric current flowing into the wire harness is less than the second overcurrent threshold according to the comparison result of the second comparator.

2. A switch circuit having an overcurrent detection function for detecting an overcurrent flowing into a single wire harness, which is connected with a plurality of load elements equipped to a vehicle, the switch circuit comprising:
 a switching element connected to the wire harness;
 a control circuit configured to control activation and deactivation of the switching element;
 a threshold circuit assigned with a first overcurrent threshold and a second overcurrent threshold, the second overcurrent threshold being less than the first overcurrent threshold;
 a first overcurrent detecting circuit configured to output a comparison result that an electric current flowing into the wire harness is greater than the first overcurrent threshold at a first cycle, which corresponds to the first overcurrent threshold, according to the electric current flowing into the wire harness and the first overcurrent threshold;
 a second overcurrent detecting circuit configured to output a comparison result that an electric current flowing into the wire harness is greater than the second overcurrent threshold at a second cycle, which corresponds to the second overcurrent threshold and is greater than the first cycle, according to the electric current flowing into the wire harness and the second overcurrent threshold; and a counter configured to count output signals of each of the first overcurrent detecting circuit and the second overcurrent detecting circuit and determine that an overcurrent flows into the wire harness to cause the control circuit to deactivate the switching element when a total count value reaches a count-up value, wherein the second overcurrent detecting circuit is configured not to output a comparison result that an electric current flowing into the wire harness is greater than the second overcurrent threshold when the first overcurrent detecting circuit outputs a comparison result that the electric current flowing into the wire harness is greater than the first overcurrent threshold.

3. The switch circuit according to claim 2, wherein
the threshold circuit includes a plurality of resistor elements connected in series, the threshold circuit is configured to cause the plurality of resistor elements to generate divided voltages including a first overcurrent threshold voltage and a second overcurrent threshold voltage, which respectively correspond to the first overcurrent threshold and the second overcurrent threshold, the first overcurrent detecting circuit includes:
 a first comparator configured to compare the first overcurrent threshold with an electric current flowing into the wire harness;
 a first count time change circuit configured to output a pulse at the first cycle; and
 a first counter time select circuit configured to output a comparison result that an electric current flowing into the wire harness is greater than the first overcurrent threshold when inputting both a comparison result from the first comparator that the electric current flowing into the wire harness is greater than the first overcurrent threshold and a pulse from the first count time change circuit, the second overcurrent detecting circuit includes:
 a second comparator configured to compare the second overcurrent threshold with an electric current flowing into the wire harness;
 a second count time change circuit configured to output a pulse at the second cycle; and
 a second counter time select circuit configured to output a comparison result that an electric current flowing into the wire harness is greater than the second overcurrent threshold when inputting both a comparison result from the second comparator that the electric current flowing into the wire harness is greater than the second overcurrent threshold and a pulse from the second count time change circuit, wherein the second counter time select circuit is configured to input a comparison result from the first comparator, and the second overcurrent detecting circuit is configured not to output a comparison result that an electric current flowing into the wire harness is greater than the second overcurrent threshold when inputting a comparison result from the first comparator that the electric current flowing into the wire harness is greater than the first overcurrent threshold.

4. The switch circuit according to claim 2, further comprising:
 a counter reset condition determination circuit configured to reset the count value of the counter when an electric current flowing into the wire harness is not greater than both the first overcurrent threshold and the second overcurrent threshold.

* * * * *